OPERATIONAL AMPLIFIER
Filed Dec. 26, 1967
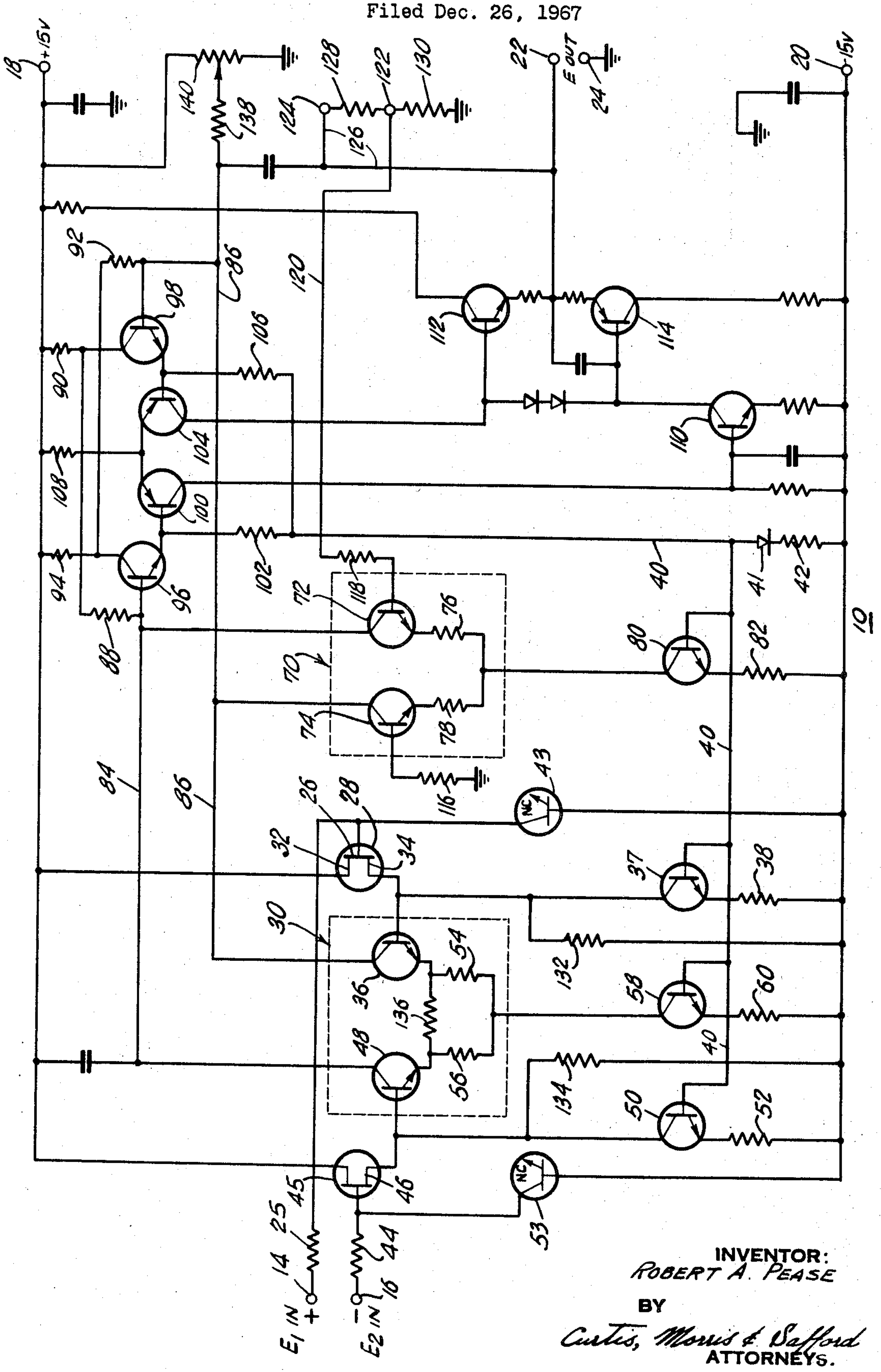
INVENTOR:
ROBERT A. PEASE
BY
Curtis, Morris & Safford
ATTORNEYS.

United States Patent Office 3,562,660
Patented Feb. 9, 1971

3,562,660
OPERATIONAL AMPLIFIER

Robert A. Pease, Wilmington, Mass., assignor to Teledyne, Inc., Los Angeles, Calif., a corporation of Delaware
Filed Dec. 26, 1967, Ser. No. 693,603
Int. Cl. H03f 3/04, 3/68
U.S. Cl. 330—30 4 Claims

ABSTRACT OF THE DISCLOSURE

A differential operational amplifier having two input amplifier stages with independent inputs and paralleled outputs, the inputs of one stage being connectable to a low level, high impedance source, the input or inputs of the other stage being connectable to negative feedback resistors for adjusting the closed loop gain of the amplifier. The respective outputs of the stages are applied in parallel to a differential-to-single-ended amplifier stage. By making each input amplifier stage with high common mode rejection ability, common mode errors are eliminated at the front end of the amplifier. By matching the characteristics of these stages, overall gain is adjustable without introducing common mode errors or affecting the signal source.

This invention relates to an operational amplifier particularly suited to applications involving differential input to single-ended output voltages.

An object of this invention is to provide a differential operational amplifier having good common mode rejection, high input impedance, and low noise.

A further object is to provide such an amplifier having gain which is adjustable without affecting the signal source or the operating parameters of the amplifier.

Still another object is to provide such an amplifier which can be produced at low cost.

These and other objects will in part be understood from and in part pointed out in the following description.

The difference between two voltages represents the information or signal to be measured in many applications such as electronic testing, data recording, medical research, etc. Frequently the signal voltages are low level (e.g. millivolts), come from high impedance (megohms) sources, and are produced in environments where large stray electric fields, such as power-line hum, are present. These fields produce what are called common mode error signals and it is not unusual for the latter to be orders of magnitude greater than the information signals produced by a typical source. Thus it is desirable in these applications for the amplifier being used to have high differential signal mode gain and minimum common mode response.

In the past, various ways of interconnecting two or more operational amplifiers to obtain differential input to single-ended output have been used. However, so far as is known all of these prior arrangements have been deficient in one or more of the following respects: cost, common mode signal rejection, input impedance, ability to adjust gain, and noise. The present invention provides a differential operational amplifier which combines the best or nearly the best of all these characteristics.

A better understanding of the invention together with a fuller appreciation of its many advantages will best be gained from the following description given in connection with the single figure of drawing which shows the schematic circuit of an amplifier embodying the invention.

The circuit 10 shown in the drawing has at the left a pair of input terminals 14 and 16. To these can be applied low level differential voltages $E_1$ (indicated as positive) and $E_2$ (indicated as negative). As seen at the right, the circuit is powered by plus and minus 15 volts D.C. applied respectively to terminals 18 and 20. A high level, low impedance output signal voltage $E_{OUT}$, proportional to the differential input signal, is obtained between terminal 22 and ground terminal 24.

Input voltage $E_1$ is applied through a small resistor 25 to the gate 26 of a field-effect transistor 28. The latter serves as a pre-amplifier with very high input impedance (e.g. $10^{11}$ ohms). It is connected to give low impedance drive to one side of a differential amplifier stage generally indicated at 30. To this end, the source 32 of transistor 28 is connective to the positive voltage supply, and the drain 34 is connected to the base of transistor 36 in amplifier stage 30. The drain impedance for transistor 28 is provided by a transistor 37 connected as shown with a resistor 38 to the negative supply and with negative feedback to its base through a common buss 40. The latter is tied to the negative supply through a silicon diode 41 and a resistor 42. To prevent excessive voltage excursions at the input of transistor 28, its gate is connected to the collector of a transistor 43 whose base is connected to the negative supply and whose emitter is left floating.

In a similar way to voltage $E_1$, input voltage $E_2$ is applied through a small resistor 44 via a preamplifier field-effect transistor 45 to amplifier stage 30, the drain 46 of transistor 45 being connected to the base of a transistor 48 in stage 30. The drain impedance for transistor 45 is provided by a transistor 50 connected with an emitter-resistor 52 to the negative supply and with negative feedback to its base from common buss 40. To prevent overloading, the gate of transistor 45 is shunted to the negative terminal by a transistor 53 connected in the same way as transistor 43.

As can be seen from the drawing transistors 28 and 45, which are identical, are symmetrically connected, with transistors 37 and 50 being paired, and with resistors 38 and 52 equal to each other. Likewise, transistors 36 and 48 in amplifier stage 30 are paired. They have, respectively, an emitter-resistor 54 and an emitter-resistor 56 the lower ends of which are in common. This common point is connected to the collector of a transistor 58 having an emitter-resistor 60 connected to the negative supply and with its base also connected to feedback buss 40.

Shown to the right of amplifier stage 30 is a closely similar stage generally indicated at 70 and comprising a transistor 72, a transistor 74, and their respective emitter-resistors 76 and 78. The latter have their lower ends connected in common to the collector of a transistor 80, with an emitter-resistor 82 connected to the negative supply and with its base connected to feedback buss 40. Transistor 80 is the same kind as transistor 58 and resistor 82 the same value as resistor 60. Similarly, resistors 54, 56, 76, and 78 are equal. By making the operating characteristics of stages 30 and 70 substantially identical, amplifier gain can be easily adjusted (in the way to be described shortly) without degrading the high input impedance and common mode rejection ability of the circuit.

The output of stage 70 is connected in parallel with the output of stage 30, the collector of transistor 72 being connected via a lead 84 to the collector of transistor 48, and the collector of transistor 74 via lead 86 to the collector of transistor 36. Lead 84 is connected through a load resistor 88 and a small feedback resistor 90 to the positive supply terminal 18. Similarly, lead 86 is connected via a load resistor 92 and a small feedback resistor 94 to the positive terminal. The differential signals from the paralleled outputs of stages 30 and 70 are applied, respectively, via lead 84 to the base of a transistor 96 and via lead 86 to the base of a transistor 98.

The emitter of transistor 96 drives the base of a PNP transistor 100 and is loaded by a relatively high ohmage resistor 102, the lower end of which is connected to buss 40. The emitter of transistor 98 drives the base of a PNP transistor 104 and is loaded by a resistor 106, equal to resistor 102 and also connected to buss 40. The commoning of buss 40 in the various stages of the circuit, as shown, provides stability and constancy for the constant current sources 50, 58, 37, and 80.

Transistors 100, 104 are connected as a differential pair with a common emitter-resistor 108. Transistor 100 drives a transistor 110. The latter together with transistor 104 drive an NPN transistor 112 and a PNP transistor 114 connected in push-pull relation to give a single-ended low impedance output between terminal 22 and ground 24. An output load (not shown) may for example have an impedance of 2500 ohms. The arrangement and interconnection of transistors 100, 104, 110, 112, and 114 is known in the art.

In order to provide for easily adjustable closed-loop gain for amplifier 10, negative feedback of proper amount is applied to amplifier stage 70. To this end the base of transistor 74 is grounded through a small isolating resistor 116, and the base of transistor 72 is connected through a small isolating resistor 118 and a lead 120 to an externally accessible terminal 122. Above the latter is another terminal 124 which is connected via an internal lead 126 to output signal terminal 22. A feedback resistor chain comprising a resistor 128 connected between terminals 122 and 124, and a resistor 130 connected between terminal 124 and ground determines the closed-loop gain of the amplifier. Resistor 130 is typically 1000 ohms and resistor 128 any suitable multiple (such as 100 times) of resistor 130. Since the open-loop gain from the inputs to amplifier stage 30 to output terminal 22 is very large, the D.C. closed-loop gain of amplifier 10 is equal to $(1+n)$, where $n$ is the ratio of resistor 128 to resistor 130. Assuming the gain of stage 30 is equal to the gain of stage 70 over the range of operating signal and temperature, the output voltage $E_{OUT}$ equals $(1+n)(E_1-E_2)$. The presence of resistors 128 and 130, which are easily changed to suit gain requirements and which are relatively low ohmage, does not load or affect the input impedance at terminals 14 and 16.

In order to compensate for minor variations in components and to optimize common mode signal rejection, transistors 37 and 50 are shunted by respective trimmer resistors 132, 134. To adjust the gain of amplifier stage 30 so that it matches that of stage 70, a trimmer resistor 136 is connected between the emitters of transistors 36 and 48. Various frequency rolloff and filter capacitors (not numbered) have been provided in accordance with known techniques. In order to adjust the output voltage to zero when the input voltages are zero, the right end of lead 86 is connected through a resistor 138 to an externally accessible potentiometer 140 connected as shown.

The above description is intended in illustration and not in limitation of the invention. Various changes or modifications in the embodiment illustrated may occur to those skilled in the art and these can be made without departing from the spirit or scope of the invention as set forth.

I claim:

1. A differential operational amplifier having high common mode signal rejection, high input impedance, and easily adjustable gain, said amplifier comprising an output stage having a pair of inputs and having a low impedance output with two output connections, a first differential amplifier stage having a pair of inputs and a pair of output leads, means to apply to the inputs of said first stage low level differential signals from a signal source, first feedback means connected in said first stage to compensate for common mode error signals, a second differential amplifier stage having a pair of inputs and a pair of output leads, second feedback means connected in said second stage to compensate for common mode error signals, means connecting the output lead of said first and second stages in parallel to the inputs of said output stage, said first and second stages being substantially identically matched in their operating characteristics, said operational amplifier having a large open-loop gain, and D.C. impedance means to connect one output connection of said output stage to one input of said second stage, and to connect the other output connection of said output stage to the other input of said second stage, the value of said D.C. impedance means determining the closed-loop gain of said operational amplifier at a desired level whereby said gain can be adjusted without substantially impairing the high input impedance and high common mode rejection of said operational amplifier.

2. The arrangement in claim 1 wherein each of said first and second stages comprises a like pair of transistors, said first and second feedback means each includes a respective transistor connected as a current source, a first electrode of the transistors in said first stage being connected by first ohmage means to said first feedback means, and a first electrode of the transistors in said second stage being connected by second ohmage means to said second feedback means, the bases of the transistors in said feedback means being connected in common by said current supply, said D.C. impedance means being externally accessable and being relatively low in ohmage.

3. A variable gain differential amplifier comprising a first differential amplifier stage with high rejection of common mode signals and having a pair of inputs and a pair of outputs, a second differential amplifier stage substantially like the first, intermediate amplifier means connecting the respective outputs of said stages in parallel, high impedance input means to connect a differential signal source to the input of said first stage, output amplifier means connected to said intermediate amplifier means and having an output, and means to apply negative feedback from the output of said output amplifier to an input of said second stage to control the closed-loop gain of the amplifier, the open-loop gain of said amplifier being very large, the gain of said differential amplifier being determined by the value of said negative feedback means, the high input impedance and high common mode rejection of said differential amplifier being substantially unaffected by the value of said negative feedback means.

4. The amplifier in claim 3 wherein said negative feedback means includes a first and a second resistor which are externally accessable, are relatively low in ohmage, and are connected in series across the output of said output amplifier, and resistance means connecting the junction of said first and second resistors to one side of the input of said second stage, the D.C. closed-loop gain of said amplifier being equal to $1+n$, where $n$ is the ratio of the resistance values of said first and second resistors.

References Cited

UNITED STATES PATENTS

| | | | |
|---|---|---|---|
| 3,370,242 | 2/1968 | Offner | 330—69X |
| 3,419,809 | 12/1968 | Lach et al. | 330—30X |
| 3,452,289 | 6/1969 | Ryan | 330—30X |
| 3,453,554 | 7/1969 | Shoemaker | 30—30 |

OTHER REFERENCES

IBM Technical Disclosure Bulletin, 2 sheets, pp. 521 and 522, vol. 10, No. 4, September 1967.

NATHAN KAUFMAN, Primary Examiner

U.S. Cl. X.R.

330—17, 24, 28, 38